(12) United States Patent
Miller

(10) Patent No.: US 7,414,418 B2
(45) Date of Patent: Aug. 19, 2008

(54) METHOD AND APPARATUS FOR INCREASING OPERATING FREQUENCY OF A SYSTEM FOR TESTING ELECTRONIC DEVICES

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/031,504

(22) Filed: Jan. 7, 2005

(65) Prior Publication Data

US 2006/0152234 A1    Jul. 13, 2006

(51) Int. Cl.
*G01R 31/02*     (2006.01)
(52) U.S. Cl. .................... 324/754; 324/158.1
(58) Field of Classification Search ........... None
See application file for complete search history.

(56) References Cited

U.S. PATENT DOCUMENTS

| | | | |
|---|---|---|---|
| 4,392,107 A * | 7/1983 | Gollomp | 324/73.1 |
| 5,172,051 A * | 12/1992 | Zamborelli | 324/72.5 |
| 5,623,214 A * | 4/1997 | Pasiecznik, Jr. | 324/754 |
| 6,362,614 B2 * | 3/2002 | Draving | 324/72.5 |
| 6,784,674 B2 * | 8/2004 | Miller | 324/754 |
| 6,798,225 B2 * | 9/2004 | Miller | 324/754 |

* cited by examiner

*Primary Examiner*—Ha Tran Nguyen
*Assistant Examiner*—Richard Isla-Rodas
(74) *Attorney, Agent, or Firm*—Kirton & McConkie; R. Scott Hauser

(57) ABSTRACT

A test system includes a communications channel that terminals in a probe, which contacts an input terminal of an electronic device to be tested. A resistor is connected between the communications channel near the probe and ground. The resistor reduces the input resistance of the terminal and thereby reduces the rise and fall times of the input terminal. The channel may be terminated in a branch having multiple paths in which each path is terminated with a probe for contacting a terminal on electronic devices to be tested. Isolation resistors are included in the branches to prevent a fault at one input terminal from propagating to the other input terminals. A shunt resistor is provided in each branch, which reduces the input resistance of the terminal and thereby reduces the rise and fall times of the input terminal. The shunt resistor may also be sized to reduce, minimize, or eliminate signal reflections back up the channel.

24 Claims, 8 Drawing Sheets

METHOD AND APPARATUS FOR INCREASING OPERATING FREQUENCY OF A SYSTEM FOR TESTING ELECTRONIC DEVICES

BACKGROUND

The present invention is generally applicable to any system in which data is driven down one or more communications channels. One example of such a system is a test system for testing electronic devices, such as semiconductor devices. FIG. 1 illustrates a simplified block diagram of a test system 100 for testing electronic devices. The test system 100 of FIG. 1 may test the dies of an unsingulated semiconductor wafer, singulated dies (packaged or unpackaged), or multi-chip modules. Such a system 100 may be configured to test other types of electronic devices, such as printed circuit boards, as well. As shown, the system 100 includes a tester 102, communications connection 104 (e.g., a coaxial cable, fiber optic link, wireless communications link, etc.), probe head 107, and a probe card 108 for communicating test signals between the tester 102 and the electronic device 112 under test ("DUT"). The test system 100 also includes a housing 106 with a moveable chuck 114 for supporting and moving the DUT 112. Probes 110 of the probe card make contact with the DUT 112 and thereby form electrical connections with the DUT.

The tester 102 generates test data, which is driven through communications channels comprising electrically conductive paths through communications connection 104, probe head 107, and probe card 108 to the input terminals (not shown in FIG. 1) of the DUT 112. Response data generated by the DUT 112 are output through output terminals of the DUT and travel to the tester 102 through compare channels (also comprising electrically conductive paths, through the probe card 108, probe head 108, and communications connection 104). Typically, the tester 102 then compares the response data generated by the DUT 112 to expected response data to determine whether the DUT 112 is good or bad. (Such testing may additionally or alternatively be used to rate operation of the DUT.)

FIG. 2 illustrates an exemplary DUT 112 with two input terminals 208 and 210, two output terminals 204 and 206, one power terminal 212, and one ground terminal 202. (A typical DUT may have many more terminals, but six terminals are shown in FIG. 2 for ease of illustration and discussion.) As shown in FIG. 2, power is provided from tester 102 to power terminal 212 through a power channel 224, which comprises electrically conductive paths through communications connection 104, probe head 107, and probe card 108, which includes probe 110*f* that contacts power terminal 212. A ground connection is similarly provided from tester 102 through ground channel 214, which terminates in probe 110*a*. Drivers 228 and 230 in tester 102 drive test data through drive channels 222 and 224, which terminate respectively in probes 110*d* and 110*e*, to input terminals 208 and 210. Response data generated by DUT 112 and output via output terminals 204 and 206 are received by comparators 232 and 234 in tester 102. (Comparators 232 and 234 may compare the response data with expected response data.) Control module 226 controls overall operation of the tester 102, provides power and ground, generates test data, acquires the results of comparing the actual response data with the expected response data, and/or generates timing signals, among other things.

FIG. 3 illustrates a partial view of tester 102, showing only drivers 228 and 230, which drive channels 222 and 220. In FIG. 3, resistor 308 represents the output impedance of a driver (228 or 230), and resistor 310 represents the characteristic impedance of a communications channel (220 or 222). In FIG. 3, it is assumed that DUT 112 is a complementary-metal-oxide-semiconductor (CMOS) device. As is known, an input terminal (e.g., 208 or 210) of a CMOS device (e.g., 112) is primarily capacitive. A simplified equivalent circuit for input terminals 208 and 210 is shown in FIG. 3 as a resistor 302 (representing an input resistance of an input terminal (e.g., 208 or 210)) in series with a capacitor 304 (representing the primarily capacitive nature of the input terminals 208 and 210). (306 represents ground.)

As is known, a change from a low to a high signal at an input terminal 208 or 210 does not register in DUT 112 until a sufficient charge builds up on capacitor 304. Similarly, a change from a high to a low signal at an input terminal 208 or 210 does not register in DUT 112 until the charge on capacitor 304 dissipates. The time needed to charge capacitor 304 is often referred to as rise time, and the time needed to discharge capacitor 304 is fall time.

As is known, the rise time of a resistor and a capacitor in series is proportional to the product of the resistance and capacitance. The time constant ($\tau$) of the rise time is as follows: $\tau = R*C$ (where $\tau$ is the time constant of the rise time or the fall time, R is the resistance of the resistor, C is the capacitance of the capacitor, and * refers to multiplication). The voltage across the capacitor 304 is as follows: $v_c(t) = C*v_d*(1-e^{-t/\tau})$ where:

$v_c(t)$ is the voltage across capacitor 304 at time t, $v_d$ is the output voltage of driver 228 or 230, t is the time from the rising edge of $v_d$ (from a low to a high voltage level), $\tau$ is the time constant, and $\tau = R*C$, R is the total resistance between each driver 228 and 230 and the capacitance 304 of each input terminal 208 and 210 (R is thus the sum of the output impedance 308 of a driver, the characteristic impedance 310 of a drive channel, and the input resistance 302 of an input terminal of DUT 112), and C is the capacitance of capacitor 304.

The fall time of a resistor and capacitor in series is also proportional to the product of the resistance and the capacitance, and the same time constant ($\tau$) is applicable. The voltage across the capacitor 304 is as follows: $v_c(t) = C*v_o*e^{-t/\tau}$ where $v_o$ is the initial charge on the capacitor and the other parameters are as defined above.

As should be apparent, the rise time and fall time of the input terminals 208 and 210 limit the frequency at which input signals to DUT 112 may be switched. As should also be apparent, the test system 100 may add to the rise and fall times of the input terminals 208 and 210 of DUT 112. This is because, for each driver 228 and 230 and drive channel 220 and 222, the output impedance 308 of the driver 228 and 230 and the characteristic impedance 310 of the channels 220 and 222 effectively increase the input resistance 302 of the input terminals 208 and 210 of DUT 112.

Another potential limit on the frequency at which DUT 112 may be switched arises from signal reflections on channels 220 and 222. A test signal driven by driver 228 or 230 down channel 222 or 220 will reflect (at least partially) off of input terminal 210 or 208 and travel back up the channel 222 or 220 toward the driver 228 or 230. If the driver output impedance 308 matches the characteristic impedance 310 of the channel (222 or 220), the reflected signal is absorbed by the driver output impedance 308 and is not further reflected back down the channel (222 or 220) toward the DUT 112. Such a configuration in which the output impedance of the driver (or source of the signal) matches the characteristic impedance of the channel is often referred to as "source termination." Even if the system shown in FIG. 3 is source terminated, the reflections that travel back up the channels 222 and 220 may cause jitter, noise, or inter-symbol interference that limits the frequency at which the input terminals 210 and 208 may be switched.

In many test applications, it would be advantageous to increase the frequency at which a DUT may be tested.

BRIEF SUMMARY

In one embodiment of the invention, a test system includes a communications channel that terminates in a probe. The probe contacts an input terminal of an electronic device to be tested, and test data is driven down the communications channel into the electronic device being tested. A resistor is connected between the communications channel near the probe and ground. The resistor, which is thus in parallel with the input resistance and capacitance of the input terminal, reduces the input resistance of the terminal and thereby reduces the rise and fall times of the input terminal. The resistor may also be sized to reduce, minimize, or eliminate reflection of signals back up the communications channel.

In a second embodiment of the invention, a test system includes a communications channel that branches into a plurality of paths, each terminating in a probe. The probes contact input terminals on electronic devices to be tested. Isolation resistors are included in the branches to prevent a fault at one input terminal from propagating to the other input terminals. A shunt resistor is provided in each branch. The shunt resistor is electrically connected from the probe to ground, again reducing the input resistance of the terminal and thereby reducing the rise and fall times of the input terminal. The shunt resistor may also be sized to reduce, minimize, or eliminate reflection of signals back up the communications channel.

DETAILED DESCRIPTION OF EXEMPLARY EMBODIMENTS

Although this specification describes exemplary embodiments and applications of the invention, the invention is not limited to these exemplary embodiments and applications or to the manner in which the exemplary embodiments and applications operate or are described herein.

Figure 2:
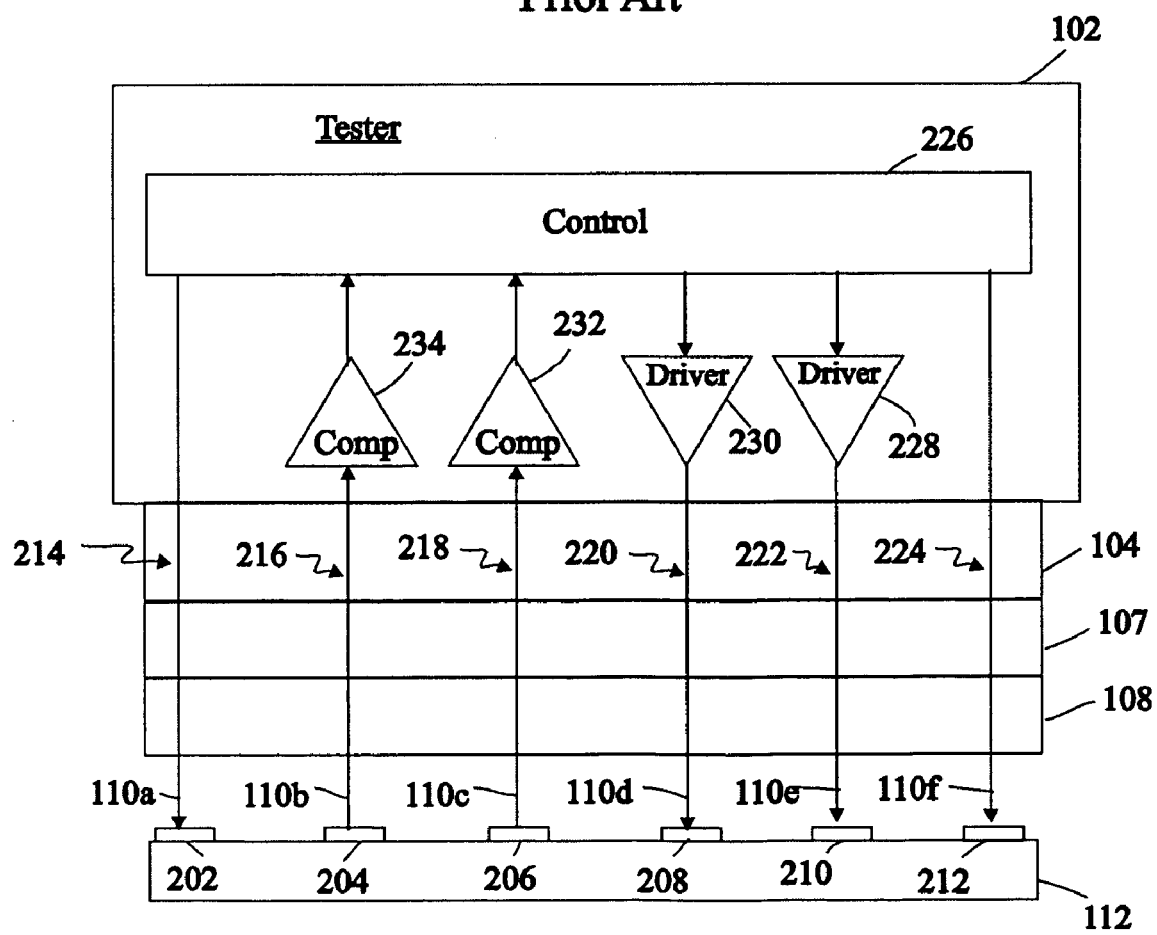
FIG. 2 illustrates a simplified block diagram of some of the elements of the test system of FIG. 1.
Figure 3:
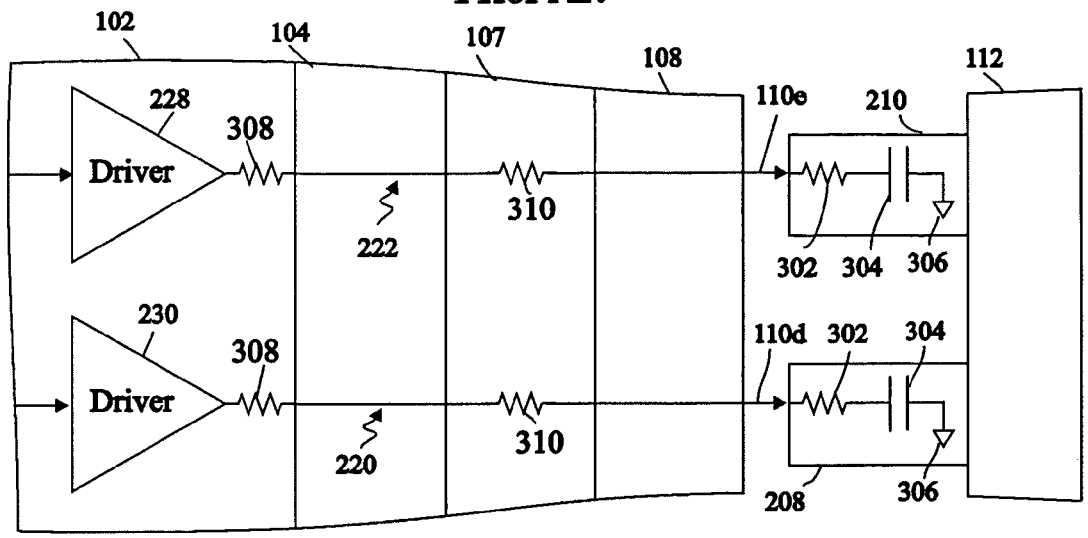
FIG. 3 illustrates a partial view of the test system shown in FIG. 2.
Figure 4:
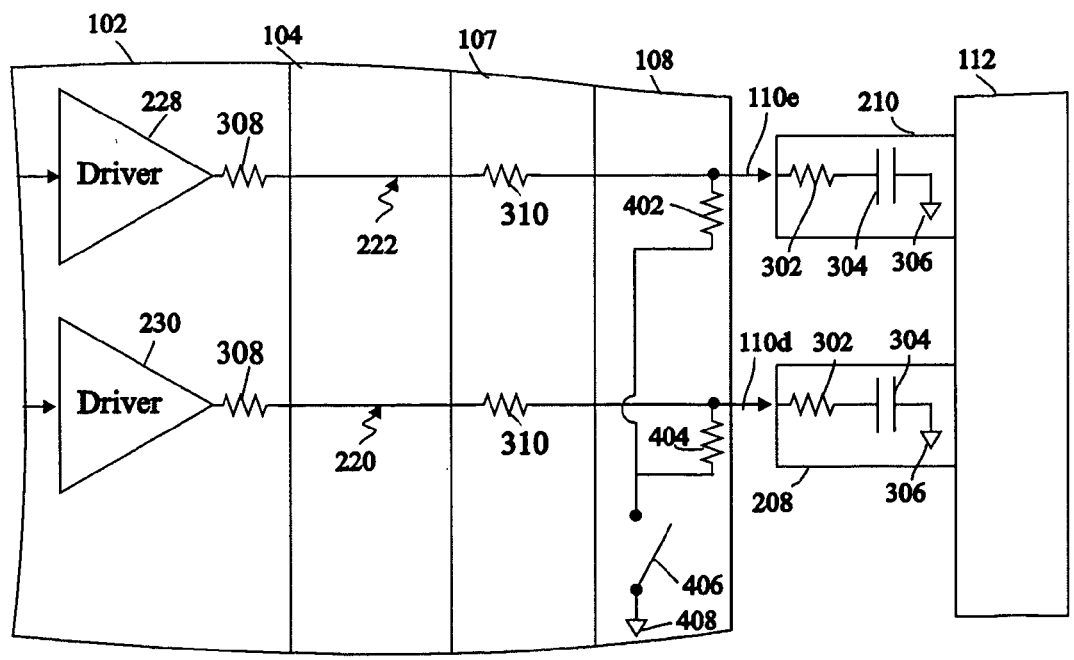
FIG. 4 illustrates a first exemplary embodiment of the invention in which shunt resistors are included in a test system to increase the frequency at which the test system may be operated.

FIG. 4 illustrates a first embodiment of the invention in which shunt resistors 402 and 404 are included to reduce rise and fall times of the input terminals 208 and 210 of DUT 112. FIG. 4 illustrates the same partial view of the test system 100 of FIG. 2 as is shown in FIG. 3. That is, two drivers 228 and 230 drive two channels 220 and 222, which comprise conductive paths through a communications connection 104, a probe head 107, and a probe card assembly 108 (which includes probes 110$d$ and 110$e$)). Probes 110$d$ and 110$e$ contact and thereby make electrical connections with input terminals 210 and 208 of DUT 112.

As shown in FIG. 4, a shunt resistor 402 and 404 is disposed at or near the probe-end of each drive channel 220 and 222. Both shunt resistors 402 and 404 are connected to ground 408. (In FIG. 4, the shunt resistors 402 and 404 are optionally connected to ground 408 through switch 406, which will be discussed below.) The presence of the shunt resistor 402 and 404 in each channel improves both the rise time and the fall time of the input terminals 208 and 210.

As should be apparent, while switch 406 is closed, each shunt resistor 402 and 404 is generally in parallel with the input resistance 302 of each terminal 208 and 210. As is known, the total resistance of two resistors in parallel is less than the resistance of either resistor by itself. (The well known equation for summing parallel resistors is $R_T = (R_1 * R_2)/(R_1 + R_2)$, where $R_T$ is the total resistance of parallel resistors $R_1$ and $R_2$, and * represents multiplication.) Thus, shunt resistors 402 and 404 reduce the total resistance between drivers 228 and 230 and input terminals 210 and 208, which in turn reduces the time constant $\tau = R*C$ and the rise and fall time of each input terminal 208 and 210. By reducing the effective resistance of the input resistance 302 of the input terminals 208 and 210, the shunt resistors 402 and 404 effectively reduce or eliminate the effects of the driver output impedance 308 and the drive channel impedance 310, both of which are in series with terminal input resistance 302 and therefore add to the rise and fall times of the input terminals. Thus, by properly sizing shunt resistors 402 and 404 to reduce the rise and fall times of the input terminals 208 and 210 of DUT 112, the frequency at which DUT 112 can be tested may be increased.

It may be possible to further improve the operating frequency of a system like the system shown in FIG. 4 by sizing shunt resistors 402 and 404 to reduce, minimize, or eliminate signal reflections. Reflections at the DUT end of a channel 222 or 220 may be reduced, minimized, or eliminated by matching or closely matching the impedance at the end of a channel 222 or 220 with the channel impedance 310. (It is assumed that the driver output impedance 308 and the channel impedance 310 are matched (that, is are of equal or approximately equal value).) This may be accomplished by sizing the shunt resistor 402 or 404 to provide a total resistance with the DUT terminal input resistance 302 at the end of a channel 222 or 220 that is equal to or approximately equal to the channel impedance 310. Note that a shunt resistor 402 or 404 is in parallel with a DUT terminal input resistance 302, and as is known, the total resistance of resistors in parallel is the product of the parallel resistors divided by the sum of the parallel resistors. Thus, to eliminate reflections, the shunt resistor 402 or 404 should be sized such that total resistance of the shunt resistor 402 or 404 and the DUT input terminal resistance 302 is equal to the channel impedance 310. Reflections can be reduced or minimized by making the total resistance of the shunt resistor 402 or 404 and the parallel DUT input terminal resistance 302 approximately equal or at least closer to equal to the channel impedance 310. For many devices, such as a CMOS device, the input impedance 302 of the device is sufficiently greater than the transmission line impedance 310 that it can be ignored, and hence, shunt resistor 402 and 404 can be made equal to the transmission line impedance 310 for adequate matching.

It should be apparent that, for each channel 222 and 220, a shunt resistor 402 or 404 forms a voltage divider with the channel impedance 310. After a DUT input terminal 210 or 208 is switched to a high state and capacitor 304 is fully charged, appreciable current stops flowing into the DUT input terminal 210 or 208 but flows through the shunt resistor 402 or 404. The voltage output by a driver 228 or 230 should be such that the voltage across the shunt resistor 402 or 404 is sufficient to keep the DUT input terminal 210 or 208 in the high state. Thus, for example, if the shunt resistor 402 or 404 is the same size as the channel impedance 310, the output voltage of a driver 228 or 230 (where the driver includes its output impedance 308 and the driver output voltage is the voltage driven onto the channel 222 or 220) should be two times the voltage needed to keep a DUT input terminal 210 or 208 in a high state. (As is known, the voltage across a second resistor in a voltage divider circuit consisting of a voltage source and first and second resistors in series is the source voltage multiplied by the resistance of the second resistor and divided by the sum of the first and second resistors.)

Switch 406 allows shunt resistors 402 and 404 to be switched into or out of use. While switch 406 is closed, shunt resistors 402 and 404 are connected to ground 408 and reduce the rise and fall times of input terminals 208 and 210 as described above. While switch 406 is open, shunt resistors 402 and 404 are effectively taken out of the test system shown in FIG. 4.

Some tests, such as parametric tests, are best performed while switch 406 is open. Parametric tests include tests to determine if one or more of the terminals of DUT 112 is shorted to ground or another terminal and tests to determine leakage current through a terminal. As described above, with switch 406 closed, the test system is ready to perform high-frequency functional tests.

Figure 1:
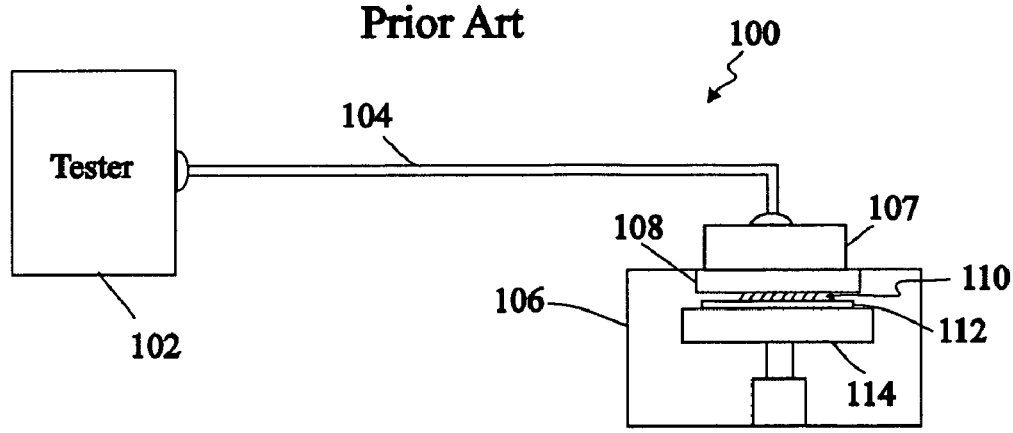
FIG. 1 illustrates an exemplary prior art test system.
Figure 5:
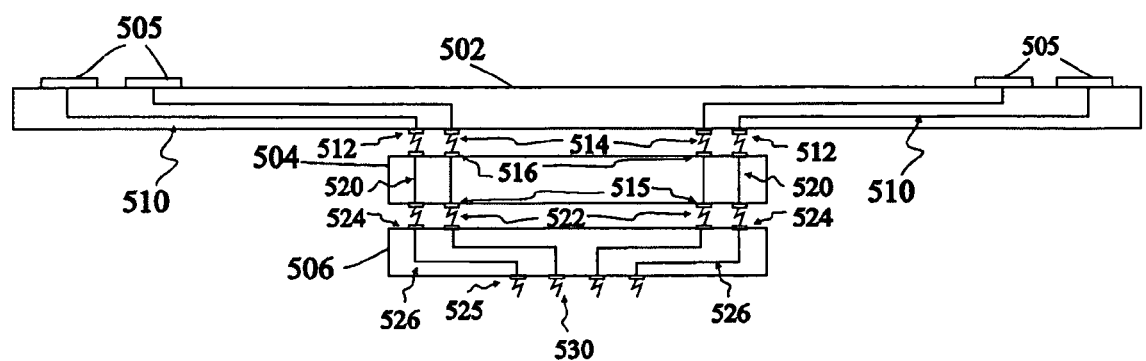
FIG. 5 illustrates an exemplary probe card assembly.

FIG. 5 illustrates an exemplary probe card assembly that may be used to test dies of a semiconductor wafer or other electronic devices, including without limitation singulated dies (packaged or unpackaged), multi-chip electronic modules, etc. The probe card assembly shown in FIG. 5 may be used in a test system like test system 100 of FIG. 1. The exemplary probe card assembly shown in FIG. 5 includes a probe board 502 with terminals 505 on one side for contacting a probe head (e.g., probe head 107 of FIG. 1). Electrical connections 510 through the probe board 502 connect terminals 505 to terminals 512. An interposer 504 electrically connects probe board terminals 512 with a probe substrate 506. The interposer 504 includes electrical contacts 514 (which may be elongate spring contacts) that engage terminals 512. The interposer's electrical contacts 514 are attached to terminals 516 on one side of the interposer 504 and are electrically connected by connectors 520 to terminals 515 on the other side of the interposer 504. Electrical contacts 522 (which may be similar to electrical contacts 514) engage terminals 524 on the probe substrate 506. Terminals 524 are electrically connected via connections 526 through the probe substrate 506 to probe terminals 525, and probes 530 for contacting a DUT (not shown in FIG. 5) are attached to probe terminals 525. There are thus provided electrical paths between terminals 505 on the probe board 502 and probes 530 on the probe substrate 506. The probe board 502, interposer 504, and probe substrate 506 may be secured one to the other using any suitable means. A more detailed description of such a probe card assembly is provided in U.S. Pat. No. 5,974,662, which is incorporated herein by reference in its entirety.

Figure 6A:
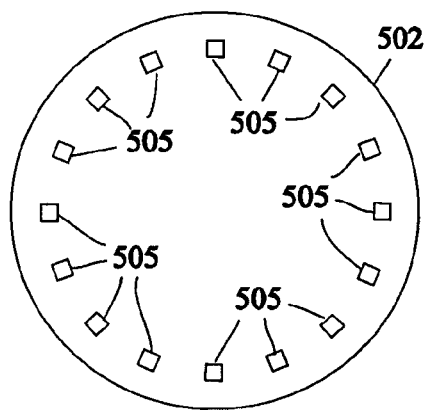
FIGS. 6A and 6B illustrate top and bottom views of the probe board in FIG. 5.
Figure 6B:
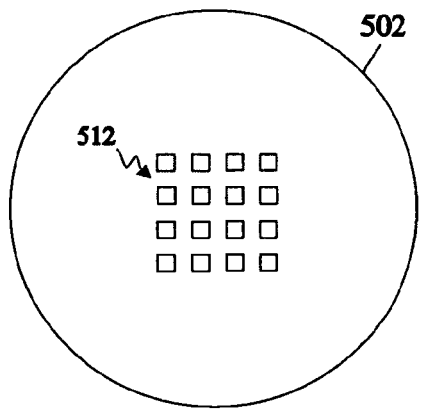
Figure 7A:
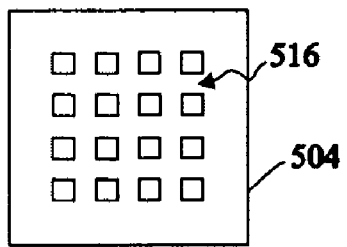
FIGS. 7A and 7B illustrate top and bottom views of the interposer in FIG. 5.
Figure 7B:
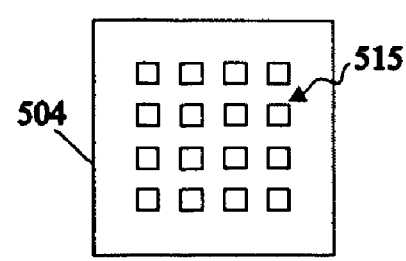
Figure 8A:
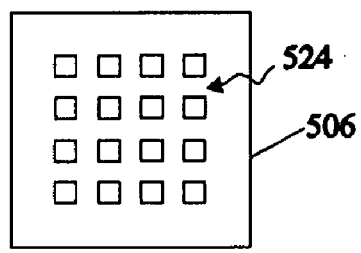
FIGS. 8A and 8B illustrate top and bottom views of the probe substrate in FIG. 5.
Figure 8B:
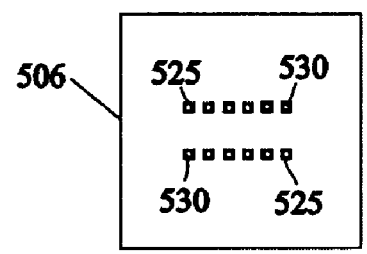

FIGS. 6A and 6B show top and bottom views, respectively, of probe board 502. As shown in FIG. 6A, terminals 505 are disposed on one side of the probe board 502, and terminals 512 are disposed on an opposite side of probe board 502. Similarly, FIGS. 7A and 7B show top and bottom views, respectively, of interposer 504, with terminals 516 on one side and terminals 515 on the opposite side. Terminals 516 on interposer 504 are arranged to correspond to terminals 512 on probe board 502. FIGS. 8A and 8B likewise show top and bottom views of the probe substrate 506, with terminals 524 disposed on one side and probe terminals 525 on the other side. Terminals 524 on probe substrate 506 are arrange to correspond to terminals 515 on interposer 504. The probe terminals 525 are arranged to correspond to positions of input, output, power, and ground terminals on one or more DUTs, and probes 530 are attached to probe terminals 525.

Shunt resistors 402 and 404 are preferably placed on the probe card assembly of FIG. 5 as close to the probes 530 as possible. Thus, shunt resistors 402 and 404 are preferably placed on the probe substrate 506. Nevertheless, shunt resistors 402 and 404 may be placed on any one or more of the probe board 502, the interposer 504 or the probe substrate 506. Moreover, the shunt resistors 402 and 404 may be placed on either side of the probe board 502, the interposer 504, or the probe substrate 506. Indeed, shunt resistors 402 and 404 may be disposed within the probe board 502, the interposer 504, or the probe substrate 506 (e.g., within probe board 502 along connections 510, within interposer 504 along connections 520, or within probe substrate 506 along connections 526). Switch 406 may likewise be placed anywhere on probe board 502, interposer 504, or probe substrate 506. Shunt resistors 402 and 404 may be implemented as thin film resistors built into or onto any of the probe board 502, interposer 504, or probe substrate 506 or as discrete resistor circuit elements attached to any of the probe board 502, interposer 504, or probe substrate 506.

Figure 9:
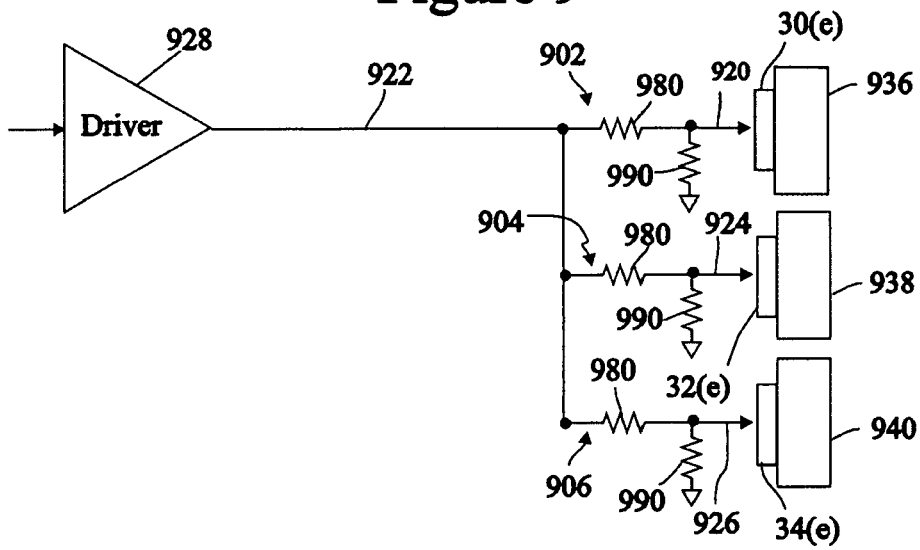
FIG. 9 illustrates a second embodiment of the invention in which shunt resistors are included in a test system to increase the frequency at which the test system may be operated.

FIG. 9 illustrates another exemplary embodiment of the invention. FIG. 9 shows a driver 928 configured to drive a channel 922, which is connected through three probes 920, 924, and 926 to input terminals 30(*e*), 32(*e*), and 34(*e*) of three DUTs 936, 938, and 940. Driver 928 and drive channel 922 may be similar to driver 228 and drive channel 222 of FIG. 2, and driver 928 and drive channel 922 may be one of many such drivers and drive channels in a test system like the test system of FIG. 2.

As shown in FIG. 9, drive channel 922 includes three branches 902, 904, and 906 that connect driver 928 through three probes 920, 924, and 926 to the three input terminals 30(*e*), 32(*e*), and 34(*e*) of the three DUTs 936, 938, and 940. In this way, test data generated at the tester 102 (see FIG. 1) for one DUT may be used to test three DUTs. Of course, a drive channel may be fanned out to fewer or more than three terminals, and some or all of the terminals may alternatively be on the same DUT. As should also be apparent, the use of additional compare channels or multiplexing schemes may be used to return the response data generated by the multiple DUTs to the tester.

In FIG. 9, an isolation resistor 980 is disposed in each branch 902, 904, and 906 to prevent a fault at one terminal (e.g., 30(e)) from adversely affecting another terminal (e.g., 32(e)). For example, absent isolation resistors 980, a fault in which terminal 30(e) is shorted to ground would short terminals 32(e) and 34(e) to ground through branches 902, 904, and 906, causing DUTs 938 and 940 to falsely test as having the same fault as DUT 936. Isolation resistors 980, however, isolate the fault at terminal 30(e) from terminals 32(e) and 34(e).

The presence of additional resistors—the isolation resistors 980—may adversely affect the rise and fall times of the terminals 30(e), 32(e), and 34(e). (As discussed above, the additional resistance may increase the value of R in the equation $\tau=R*C$ for each input terminal 30(e), 32(e), and 34(e) and therefore increase the rise and the fall times of each input terminal.) In fact, the greater the number of branches (e.g., 902, 904, and 906), the greater the potential affect on the rise and fall times of the input terminals 30(e), 32(e), and 34(e). As shown in FIG. 9, a shunt resistor 990 connected to ground is disposed in each branch 902, 904, and 906. As also discussed above, the shunt resistors 990, which are effectively in parallel with the input resistance of each terminal 30(e), 32(e), and 34(e), will reduce the effects of the isolation resistors 980 and generally improve the rise and fall times of input terminals 30(e), 32(e), and 34(e).

As should be apparent, the shunt resistors 990 in each branch 902, 904, and 906 form a voltage divider circuit with the isolation resistor 980 in each branch 902, 904, and 906. As discussed above with respect to FIG. 4, the shunt resistor 990 and the isolation resistor 980 in each branch 902, 904, and 906 should be sized so that, while driver 928 outputs a high signal, sufficient voltage is maintained at each probe 920, 924, and 926 to maintain each input terminal 30(e), 32(e), and 34(e) of DUTs 936, 938, and 940 in a high state. It should be noted that, for simplicity and ease of illustration, neither an output impedance for driver 928 nor a channel impedance for channel 922 is shown in FIG. 9 but such impedances are present. As discussed above with regard to FIG. 4, shunt resistors 990 and isolation resistors 980 may be sized to reduce, minimize, or eliminate reflections of a signal driven down channel 922 by driver 928. It should also be noted that one or more switches like switch 406 of FIG. 4 may be included in FIG. 9 to switch shunt resistors 990 in and out of effective connection with the branches 902, 904, and 906, which may facilitate parametric testing as discussed above with regard to FIG. 4.

Figure 10:
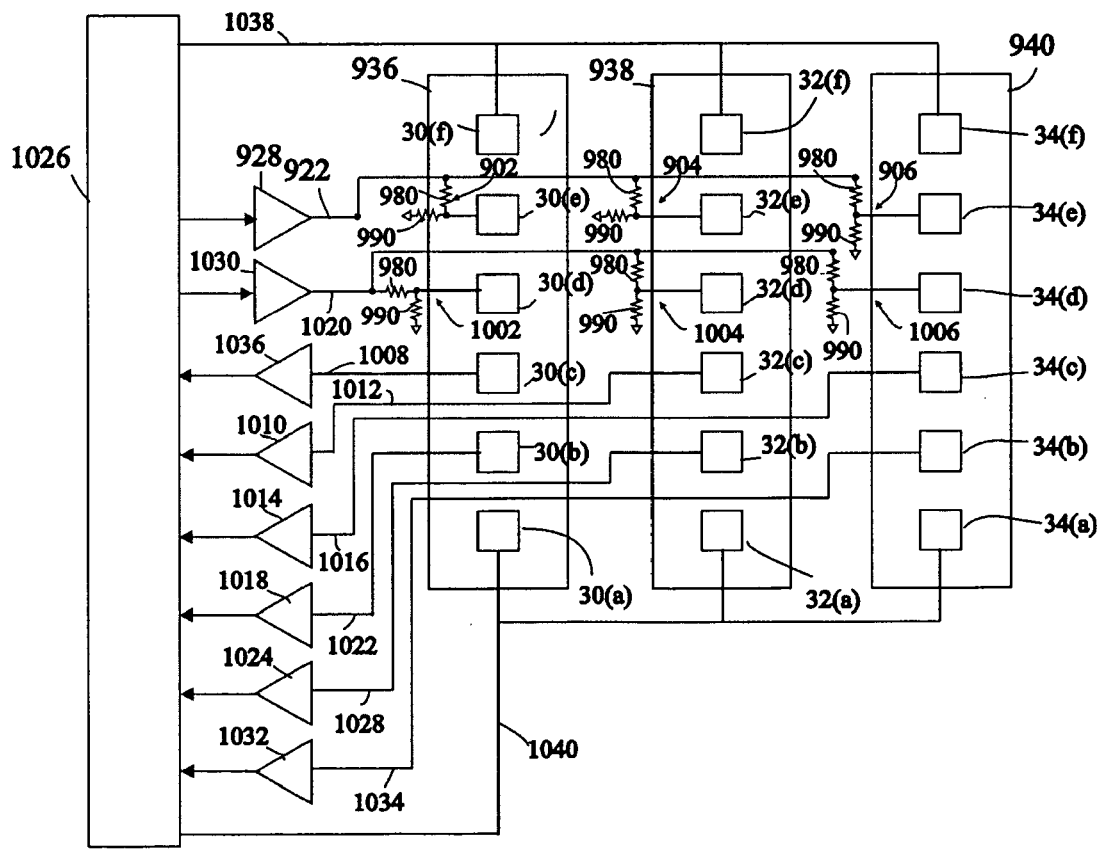
FIG. 10 illustrates use of shunt resistors in a test system that fans out test data to more than one device under test.

FIG. 10 illustrates an exemplary implementation of the use of shunt resistors with isolation resistors. The exemplary test system shown in FIG. 10 shows driver 928 and drive channel 922 of FIG. 9 in a test system for testing the three DUTs 936, 938, and 940 shown in FIG. 9.

As shown in FIG. 10, two drivers 928 and 1030 drive two drive channels 922 and 1020. Drive channel 922 is fanned out through three branches 902, 904, and 906 to three input terminals 30(e), 32(e), and 34(e) on each of DUTs 936, 938, and 940. Each branch 902, 904, and 906 includes an isolation resistor 980 and a shunt resistor 990 connected to ground. Drive channel 1020 is similarly fanned out through three branches 1002, 1004, and 1006 to three input terminals 30(d), 32(d), and 34(d) on each of DUTs 936, 938, and 940, and each branch 1002, 1004, and 1006 also includes an isolation resistor 980 and a shunt resistor 990 connected to ground. Comparators 1036, 1010, 1014, 1018, 1024, and 1032 are connected through compare channels 1008, 1012, 1016, 1022, 1028, and 1034 to output terminals 30(c), 30(b), 32(c), 32(b), 34(c), and 34(b) of DUTs 936, 938, and 940 as shown in FIG. 10. A controller (which may be similar to controller 226 in FIG. 2 above) controls input of test data to drivers 928 and 1030 and receives response data from comparators 1036, 1010, 1014, 1018, 1024, and 1032. Controller 1026 also provides power through power channels 1038 to power terminals 30(f), 32(f), and 34(f) of DUTs 936, 938, and 940 and ground through ground channels 1040 to ground terminals 30(a), 32(a), and 34(a) of DUTs 936, 938, and 940. In this way, drivers and drive channels sufficient to test only one DUT are used to test three DUTs; isolation resistors are provided to prevent a fault on one DUT from causing the other DUTs to falsely test as bad; and shunt resistors are provided to increase the rise and fall times of the input terminals of the DUTs.

The isolation resistors 980 and shunt resistors 990 shown in FIGS. 9 and 10 may be implemented on a probe card assembly, such as the exemplary probe card assembly illustrated in FIG. 5. Like shunt resistors 402 and 404 in FIG. 4, isolation resistors 980 and shunt resistors 990 may be placed on any one or more of the probe board 502, the interposer 504 or the probe substrate 506 of a probe card assembly like the one shown in FIG. 5. Moreover, the isolation resistors 980 and shunt resistors 990 may be placed on either side of the probe board 502, the interposer 504, or the probe substrate 506. Indeed, isolation resistors 980 and shunt resistors 990 may be disposed within the probe board 502, the interposer 504, or the probe substrate 506 (e.g., within probe board 502 along connections 510, within interposer 504 along connections 520, or within probe substrate 506 along connections 526). Isolation resistors 980 and shunt resistors 990 may be implemented as thin film resistors or as discrete resistor circuit elements.

Figure 11A:
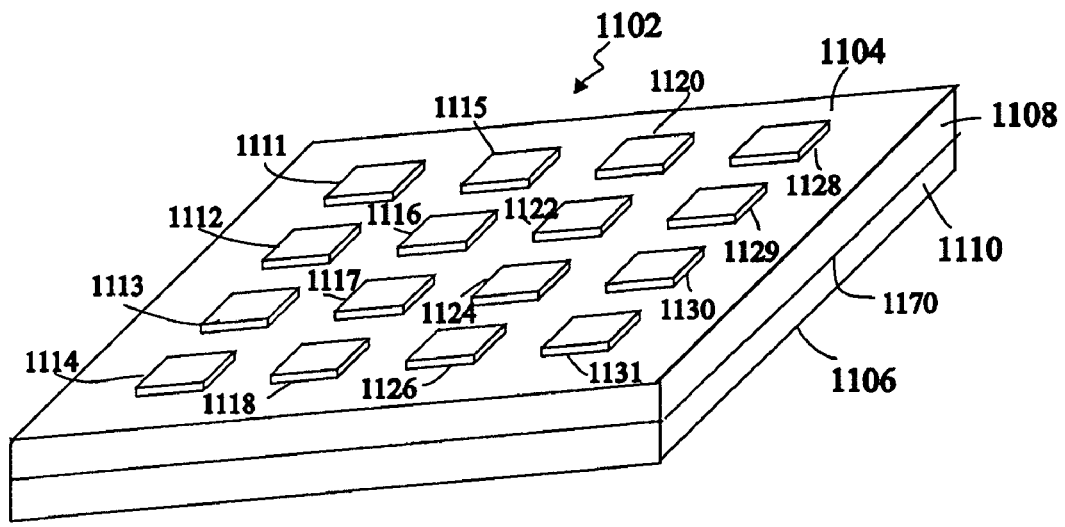
FIG. 11A illustrates a top, perspective view of a probe substrate configured for a probe card assembly for use in the test system of FIG. 10.
Figure 11B:
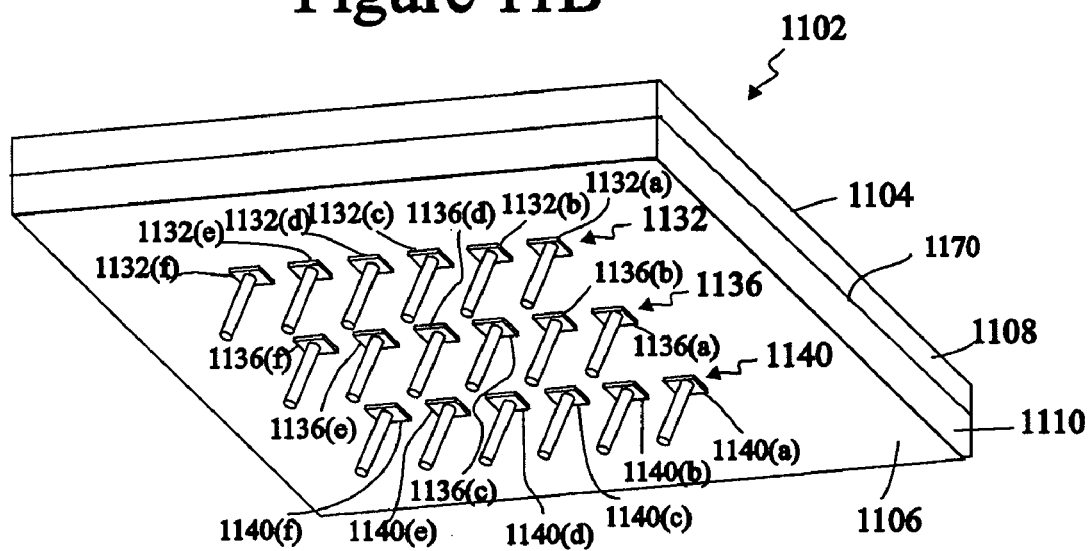
FIG. 11B illustrates a bottom, perspective view of the probe substrate of FIG. 11A.
Figure 12:
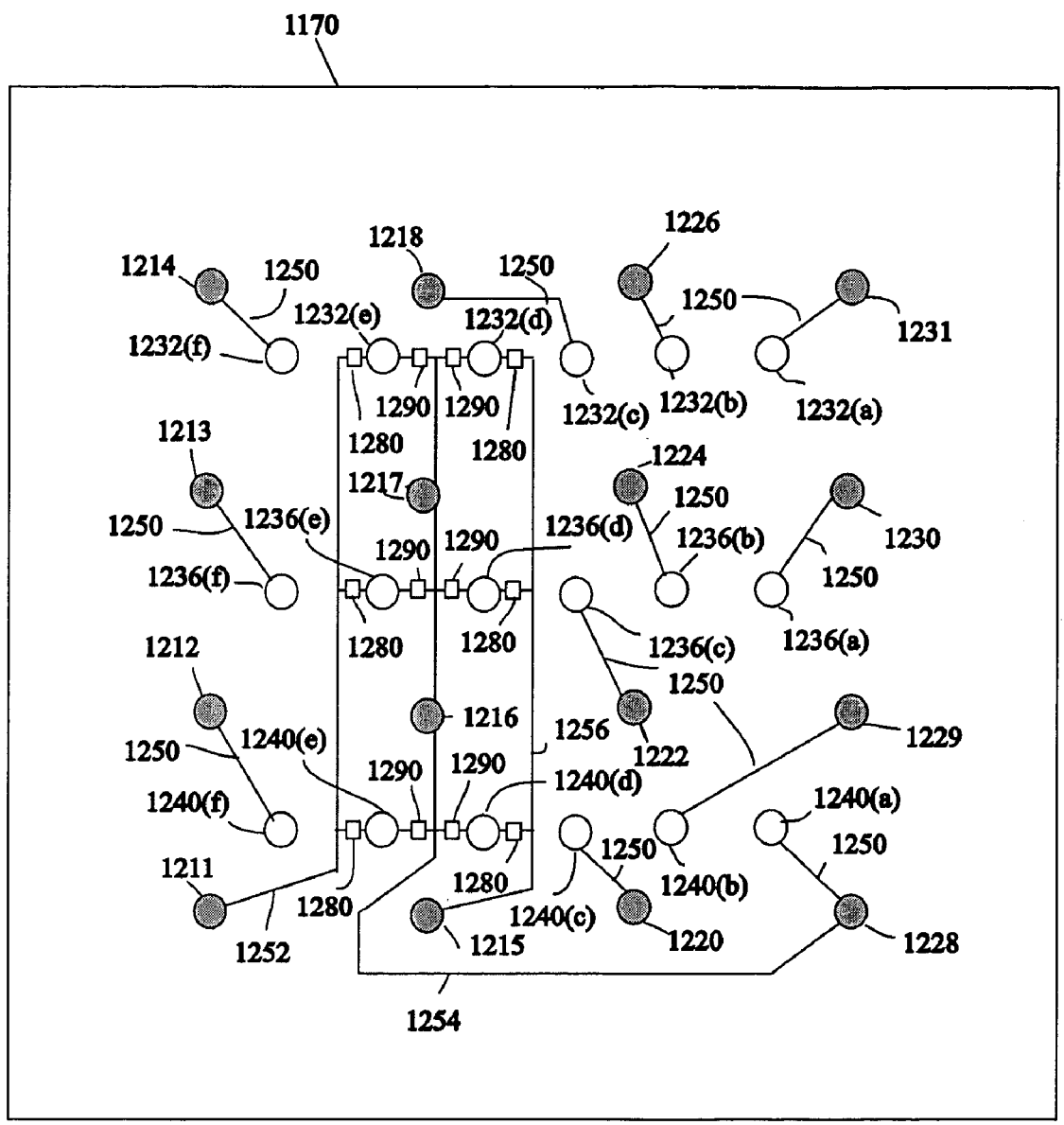
FIG. 12 depicts an interface between the two layers that compose the probe substrate of FIG. 11A.
Figure 13A:
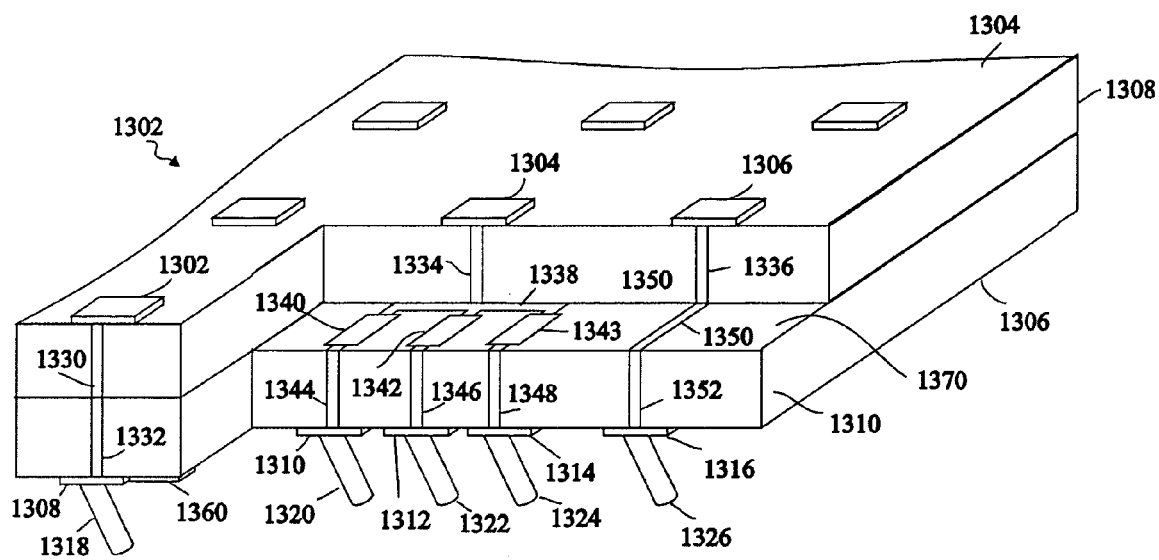
FIG. 13A illustrates a cross-sectioned, top, perspective view of part of a probe substrate.
Figure 13B:
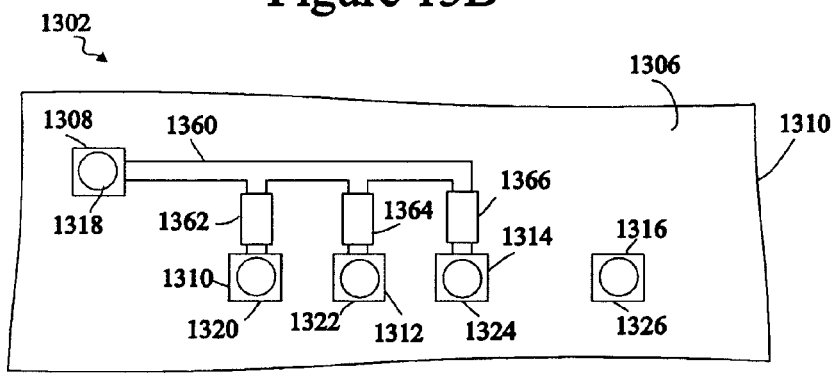
FIG. 13B illustrates a bottom view of part of the probe substrate of FIG. 13A.

FIGS. 11A through 13B illustrate examples in which isolation resistors 980 and shunt resistors 990 are implemented as thin film resistors on a probe substrate 1102 or 1302 that may take the place of probe substrate 506 in FIG. 5. In the example shown in FIGS. 11A through 12B, isolation resistors 980 and shunt resistors 990 are implemented as thin film resistors 1280 and 1290 between 1170 two layers 1108 and 1110 that comprise probe substrate 1102. In FIGS. 13A and 13B, isolation resistors 980 are implemented as thin film resistors 1340, 1342, and 1343 within probe substrate 1302, and shunt resistors 990 are implemented as thin film resistors 1362, 1364, and 1366 on a bottom surface 1306 of probe substrate 1302.

FIGS. 11A and 11B illustrate top-perspective and bottom perspective views, respectively, of an exemplary probe substrate 1102 (which may be similar to and used in place of probe substrate 506 in FIG. 5). As will be seen, the probe substrate 1102 is configured to implement the exemplary test system shown in FIG. 10. Terminals 111, 1112, 1113, 1114, 1115, 1116, 1117, 1118, 1120, 1122, 1124, 1126, 1128, 1129, 1130, and 1131 on surface 1104 of probe substrate 1102 are disposed to contact connections 522 from interposer 504 (see FIG. 5) and, for convenience, will hereinafter be referred to as "interposer-terminals."

In this example, interposer-terminals 1112, 1113, and 1114 are wired through interposer 504 and probe board 502 of the probe card assembly of FIG. 5 to power channels 1040 of FIG. 10). Interposer-terminals 1128, 1130, and 1131 are similarly wired through interposer 504 and probe board 502 to ground channels 1038. Interposer terminals 1118, 1120, 1122, 1124, 1126, and 1129 are likewise wired though interposer 504 and probe board 502 to compare channels 1008, 1012, 1016, 1022, 1028, and 1034, and interposer-terminals 1111 and 1115 are wired through interposer 504 and probe board 502 to drive channels 922 and 1020. (Interposer terminals 1116 and 1117 are not used in this example.)

Probe terminals (to which probes are attached) are disposed on the bottom surface 1106 of the probe substrate 1102. The probe terminals are organized into three rows 1132, 1136, and 1140 with six terminals in each row. Each row 1132, 1136, and 1140 corresponds to one DUT 936, 938, and 940, and each terminal in each row corresponds to one terminal on one of the DUTs. In this example (in which the probe substrate 1102 is configured to test DUTs 936, 938, and 940 of FIG. 10), the probes attached to probe terminals 1132(f), 1136(f), and 1140(f) are power probes for providing power to power terminals 30(f), 32(f), and 34(f) of DUTs 936, 938, and 940. The probes attached to probe terminals 1132(a), 1136(a), and 1140(a) are ground probes for providing ground to ground terminals 30(a), 32(a), and 34(a) of DUTs 936, 938, and 940. The probes attached to probe terminals 1132(c), 1132(b), 1136(c), 1136(b), 1140(c), and 1140(b) are disposed to contact output terminals 30(c), 30(b), 32(c), 32(b), 33(c), and 34(b) of DUTs 936, 938, and 940; and the probes attached to probe terminals 1132(e), 1132(d), 1136(e), 1136(d), 1140(e), and 1140(d) are disposed to contact input terminals 30(e), 30(d), 32(e), 32(d), 33(e), and 34(d) of DUTs 936, 938, and 940.

The probe substrate illustrated in FIGS. 11A and 11B may be made of multi-layers. For purposes of illustration and discussion, the probe substrate 1102 is illustrated in FIGS. 11A and 11B as having two layers 1108 and 1110, which may be two substrates that are adhered one to another. Electrical paths between the interposer-terminals (e.g., 1111) on surface 1104 and the probe terminals (e.g., 1140(f)) on surface 1106 may be provided by vias (not shown in FIGS. 11A and 11B) through the first layer 1108, traces (not shown in FIGS. 11A and 11B) located between 1170 the first layer 1108 and the second layer 1110, and vias (not shown in FIGS. 11A and 11B) through the second layer 1110. FIG. 12 illustrates an example of the foregoing.

FIG. 12 illustrates an exemplary configuration for an interface 1170 between the first layer 1108 and the second layer 1110 of the probe substrate 1102. In FIG. 12, vias that pass through first layer 1108 and electrically connect to interposer-terminals (e.g., 1111) on surface 1104 are represented by darkened circles (i.e., elements 1211, 1212, 1213, 1214, 1215, 1216, 1217, 1218, 1220, 1222, 1224, 1226, 1228, 1229, 1230, and 1231). Vias that pass through second layer 1110 and electrically connect to probe terminals (e.g., 1140(f)) on surface 1106 are represented by undarkened circles (i.e., 1232(a)-(f), 1236(a)-(f), and 1240(a)-(f)). Electrically conductive traces are shown as 1250, 1252, 1254, and 1256 in FIG. 12, and such traces may be disposed on the inner surface of either layer 1108 or 1110 to connect vias through layer 1108 with vias through layer 1110 while the layers 1104 and 1106 are adhered together as shown in FIGS. 11A and 11B.

Interposer-terminals (e.g., 1111) on surface 1104 of the probe substrate 1102 that provide power, ground, or connections to compare channels are connected to probe terminals (e.g., 1140(f)) on surface 1106 of the probe substrate 1002 on a one-to-one basis. In the current example (in which the probe substrate 1102 is configured to be used in the system shown in FIG. 10), interposer-terminals 1112, 1113, and 1114 (which as discussed above are connected to power channels 1140 shown in FIG. 10) are connected to power probe terminals 1132(f), 1136(f), and 1140(f) through the following via pairs shown in FIG. 12: 1214 and 1232(f), 1213 and 1236(f), and 1212 and 1240(f). (A trace 1250 electrically connects each of the foregoing via pairs, as shown in FIG. 12.) Similarly, interposer-terminals 1128, 1130, and 1131 (which as discussed above are connected to ground channels 1138 shown in FIG. 10) are connected to ground probe terminals 1132(a), 1136(a), and 1140(a) through the following via pairs shown in FIG. 12: 1228 and 1240(a), 1230 and 1236(a), and 1231 and 1232(a). (Again, a trace 1250 electrically connects each of the foregoing via pairs, as shown in FIG. 12.) In like manner, interposer-terminals 1118, 1120, 1122, 1124, 1126, and 1129 (which are connected to compare channels 1008, 1012, 1016, 1022, 1028, and 1034 in FIG. 10) are connected to probe terminals 1132(b), 1132(c), 1136(b), 1136(c), 1140(b), and 1140(c) through the following via pairs shown in FIG. 12: 1218 and 1232(c), 1226 and 1232(b), 1222 and 1236(c), 1224 and 1236(b), 1220 and 1240(c), and 1229 and 1240(b).

On the other hand, each interposer terminal on surface 1104 of the probe substrate 1102 that provides a connection to a drive channel is connected to multiple probe terminals on surface 1106 of the probe substrate 1102. In the example shown in FIG. 12, interposer-terminal 1111 (which as described above is connected to drive channel 922), is connected through via 1211 to trace 1252, which is electrically connected to vias 1240(e), 1236(e), and 1232(e), which in turn are connected, respectively, to probe terminals 1140(e), 1136(e), and 1132(e). Via 1211, trace 1252, and vias 1140(e), 1136(e), and 1132(e) thus connect interposer terminal 1111 with three probe terminals: 1140(e), 1136(e), and 1132(e). Similarly, interposer-terminal 1115 (which as described above is connected to drive channel 1020), is connected through via 1215 to trace 1256, which is electrically connected to vias 1240(d), 1236(d), and 1232(d), which in turn are connected, respectively, to probe terminals 1140(d), 1136(d), and 1132(d). Via 1215, trace 1256, and vias 1140(d), 1136(d), and 1132(d) thus connect interposer terminal 1115 with three probe terminals: 1140(d), 1136(d), and 1132(d).

As shown in FIG. 12, thin film resistors 1280 are disposed between trace 1252 and each of vias 1240(e), 1236(e), and 1232(e). Thin film resistors 1280 are also disposed between trace 1256 and each of vias 1240(d), 1236(d), and 1232(d). Thin film resistors 1280 therefore implement isolation resistors 980 in FIG. 10. Thin film resistors 1290 are also disposed between each of vias 1240(e), 1236(e), 1232(e), 1240(d), 1236(d), and 1232(d), on one hand, and a trace 1254 connected to ground (e.g., via 1228, which is connected through interposer-terminal 1128 to one of ground channels 1040 (see FIG. 10)). Thin film resistors 1290 are thus an implementation of shunt resistors 990 in FIG. 10.

As mentioned above, FIGS. 13A and 13B illustrate another exemplary way of implementing isolation resistors 980 and shunt resistors 910 on a probe substrate 1302. FIG. 13A illustrates a cut-away perspective view of a portion of a probe substrate 1302 that may be generally similar to probe substrate 1102 of FIGS. 11A and 11B. FIG. 13B illustrates a bottom view of part of probe substrate 1302.

Like probe substrate 1102, probe substrate 1302 (which may take the place of probe substrate 506 in FIG. 5) includes two layers 1308 and 1310 and has interpose terminals (1302, 1304, and 1306 are shown) on a first surface 1304 and probe terminals (1308, 1310, 1312, 1314, and 1316 are shown) to which probes (1318, 1320, 1322, 1324, and 1326 are shown) on a second surface 1306. In FIG. 13A, interposer terminal 1302 is a configured to provide a ground connection to a DUT (not shown in FIGS. 13A and 13B) and is connected through vias 1330 and 1332 to probe terminal 1308 and ground probe 1318 as shown in FIG. 13A. Interposer terminal 1306 is configured to connect to an compare channel and thus carry output data produced by the DUT (not shown in FIGS. 13A and 13B) to a comparator at the end of a compare channel. As shown in FIG. 13A, interposer terminal 1306 is connected to probe terminal 1316 (to which output probe 1326 is attached) by via 1336 through layer 1308, trace 1350 disposed on surface 1370 of second layer 1310, and via 1352 through the second layer 1310.

Interposer-terminal 1304 is configured to connect to a drive channel and thus provide test data to a DUT (not shown in FIGS. 13A and 13B). In order to implement the test configuration shown in FIG. 10, interposer-terminal 1304 is connected to three probe terminals (1310, 1312, and 1314) to which are attached three input probes 1320, 1322, and 1324 configured to contact input terminals of three DUTs (not shown in FIGS. 13A and 13B). As shown in FIG. 13A, via 1334 connects interposer-terminal 1304 to trace 1338 on surface 1370 of the second layer 1310 of the probe substrate 1302. Thin film resistors 1340, 1342, and 1343 on surface 1370 connect trace 1338 to three vias 1344, 1346, and 1348, which in turn are connected to probe terminals 1310, 1312, and 1314. Thin film resistors 1340, 1342, and 1343 thus implement isolation resistors 980 shown in FIGS. 9 and 10. As shown in FIG. 13B, on the second surface 1310 of probe substrate 1302, thin film resistors 1362, 1364, and 1366 electrically connect each of probe terminals 1310, 1312, and 1324 to a trace 1360 from ground terminal 1308. Thin film resistors 1362, 1364, and 1366 thus implement shunt resistors 990 shown in FIGS. 9 and 10.

Although exemplary embodiments and applications of the invention have been described herein, there is no intention that the invention be limited to these exemplary embodiments and applications or to the manner in which the exemplary embodiments and applications operate or are described herein. Indeed, many variations and modifications to the exemplary embodiments are possible. For example, the embodiments discussed above may be implemented on an apparatus other than the probe card assembly shown in FIG. 5. For example, the embodiments discussed above may be implemented on a load board for testing singulated dies. As another example, the embodiments may be implemented on a different type of probe card assembly, such a probe card assembly that includes more or fewer elements than the exemplary probe card assembly shown in FIG. 5 (e.g., a probe card assembly that lacks an interposer or that lacks an interposer and a probe substrate (in which case probes 530 would be attached directly to the probe board 502)).

The invention claimed is:

1. An apparatus for interfacing test signals between a tester and an electronic device under test, said apparatus comprising:
    a structure;
    a plurality of channel terminals disposed on said structure and configured to connect electrically with communications channels from said tester;
    a plurality of probes disposed on said structure and configured to contact test features of said electronic device;
    a plurality of electrically conductive paths connecting ones of said channel terminals with ones of said probes; and
    a plurality of shunt resistors disposed on said structure, each said shunt resistor directly connected to one of said conductive paths, wherein:
    at least one of said conductive paths comprises a plurality of branches,
        each said branch is electrically connected to one of said channel terminals,
        each said branch terminates in a different one of said probes,
        each said branch comprises an isolation resistor disposed within the branch between said channel terminal and said probe in which said branch terminates, and
        each said branch is electrically connected from between said isolation resistor disposed within said branch and said probe in which said branch terminates, through one of said shunt resistors to a voltage potential.

2. The apparatus of claim 1, wherein said shunt resistors are thin film resistors.

3. The apparatus of claim 1, wherein said structure comprises a first substrate on which said probes are disposed.

4. The apparatus of claim 3, wherein said shunt resistors are disposed on said first substrate.

5. The apparatus of claim 4, wherein said shunt resistors are thin film resistors.

6. The apparatus of claim 4, wherein said probes and said shunt resistors are disposed on a first surface of said first substrate.

7. The apparatus of claim 4, wherein said shunt resistors are disposed within said first substrate.

8. The apparatus of claim 3, wherein said structure further comprises a second substrate on which said channel terminals are disposed.

9. The apparatus of claim 1, wherein said structure comprises a first substrate on which said probes are disposed.

10. The apparatus of claim 9, wherein said shunt resistors are disposed on said first substrate.

11. The apparatus of claim 10, wherein said isolation resistors are disposed on said first substrate.

12. The apparatus of claim 10, wherein said probes and said shunt resistors are disposed on a first surface of said first substrate.

13. The apparatus of claim 10, wherein said shunt resistors are thin film resistors and said isolation resistors are thin film resistors disposed on said first substrate.

14. The apparatus of claim 10, wherein said shunt resistors are disposed within said first substrate.

15. The apparatus of claim 1, wherein each said shunt resistor is connected to one of said conductive paths so as to reduce an input resistance of one of said test features of said electronic device.

16. The apparatus of claim 1, wherein each said shunt resistor is connected from one of said conductive paths to ground.

17. The apparatus of claim 1, wherein said communications channels are not disposed on said structure.

18. The apparatus of claim 1, wherein said voltage potential is ground.

19. For use in a test system comprising a tester and a plurality of drive channels terminating in probes, a method of testing an electronic device comprising a plurality of input terminals comprising capacitance, said method comprising:
    bringing said probes into contact with said input terminals;
    utilizing switches to connect shunt resistors to ones of said drive channels, wherein said switches are configured selectively to connect and disconnect said shunt resistors from said ones of said drive channels;
    providing test signals from said tester through said ones of said drive channels to said electronic device, wherein said test signals are alternating current signals;
    utilizing said switches to disconnect said shunt resistors from said ones of said drive channels; and
    providing second test signals through said drive channels while said shunt resistors are disconnected from said ones of said channels, said second test signals comprising direct current signals.

20. The method of claim 19, wherein said shunt resistors are configured to increase a frequency at which said test signals can be provided from said tester through said ones of said drive channels to said electronic device.

21. The method of claim 19, wherein said shunt resistors decrease rise times of said input terminals.

22. The method of claim 21, wherein said shunt resistors decrease fall times of said input terminals.

23. The method of claim 19, wherein while said shunt resistors are connected to said ones of said drive channels, each said shunt resistor provides a resistive electrical path between one of said drive channels and ground.

24. The method of claim 19 further comprising testing functional operation of said electronic device utilizing said test signals.

* * * * *